United States Patent
Sugino et al.

(10) Patent No.: US 7,026,211 B1
(45) Date of Patent: Apr. 11, 2006

(54) SEMICONDUCTOR COMPONENT AND METHOD OF MANUFACTURE

(75) Inventors: Rinji Sugino, San Jose, CA (US); Joong S. Jeon, Cupertino, CA (US); Robert B. Ogle, Jr., San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 10/795,890

(22) Filed: Mar. 8, 2004

(51) Int. Cl.
  *H01L 21/336* (2006.01)

(52) U.S. Cl. ............ 438/257; 257/370; 257/371; 257/377; 257/379; 257/276; 437/31; 437/34; 437/58

(58) Field of Classification Search .......... 438/592, 438/658, 660; 257/656, 67, 75, 370, 371, 257/377, 379, 276; 437/31, 58, 34
See application file for complete search history.

(56) References Cited

U.S. PATENT DOCUMENTS

| | | | |
|---|---|---|---|
| 5,182,225 A * | 1/1993 | Matthews | ............ 438/202 |
| 6,037,238 A | 3/2000 | Chang et al. | |
| 6,043,153 A | 3/2000 | Nogami et al. | |
| 6,218,309 B1 | 4/2001 | Miller et al. | |
| 6,228,727 B1 | 5/2001 | Lim et al. | |
| 6,271,100 B1 | 8/2001 | Ballantine et al. | |
| 6,335,249 B1 | 1/2002 | Thei et al. | |
| 6,426,547 B1 * | 7/2002 | Greenberg et al. | .......... 257/656 |
| 6,437,417 B1 | 8/2002 | Gilton | |
| 6,448,131 B1 | 9/2002 | Cabral, Jr. et al. | |
| 6,495,876 B1 | 12/2002 | Bronner et al. | |
| 6,498,067 B1 | 12/2002 | Perng et al. | |
| 6,511,888 B1 | 1/2003 | Park et al. | |
| 6,544,860 B1 | 4/2003 | Singh | |
| 6,548,336 B1 | 4/2003 | Avanzino et al. | |
| 6,555,430 B1 | 4/2003 | Chudzik et al. | |
| 6,559,002 B1 | 5/2003 | Kudelka et al. | |
| 6,780,741 B1 * | 8/2004 | Chen et al. | ............ 438/592 |
| 2001/0014513 A1 | 8/2001 | Levy | |
| 2002/0001916 A1 | 1/2002 | Chen et al. | |
| 2002/0072219 A1 | 6/2002 | Avanzino et al. | |
| 2002/0106892 A1 | 8/2002 | Shibata et al. | |

FOREIGN PATENT DOCUMENTS

| | | |
|---|---|---|
| JP | 2002343805 | 11/2002 |
| KR | 2001026744 | 4/2001 |
| KR | 2001108828 | 12/2001 |
| KR | 2002089614 | 11/2002 |

* cited by examiner

*Primary Examiner*—Mai-Huong Tran
(74) *Attorney, Agent, or Firm*—Paul Drake; Rennie Wm. Dover

(57) ABSTRACT

A semiconductor component having smooth, void-free conductive layers and a method for manufacturing the semiconductor component. Surface features such as gate structures are formed on a semiconductor substrate. A layer of insulating material is formed on the gate structures and a layer of polysilicon is formed on the layer of insulating material. The layer of polysilicon is annealed in a hydrogen ambient to redistribute the silicon atoms of the polysilicon layer. Redistribution of the atoms fills voids that may be present in the layer of polysilicon and smoothes the surface of the layer of polysilicon. Another layer of polysilicon is formed over the annealed layer of polysilicon. This polysilicon layer is annealed in a hydrogen ambient to redistribute the silicon atoms and smooth the surface of the polysilicon layer, thereby forming a subsequently annealed polysilicon layer. Control gate structures are formed from the subsequently annealed polysilicon layer.

17 Claims, 3 Drawing Sheets

SEMICONDUCTOR COMPONENT AND METHOD OF MANUFACTURE

FIELD OF THE INVENTION

The present invention relates, in general, to a semiconductor component and, more particularly, to surface topographies in a semiconductor component.

BACKGROUND OF THE INVENTION

Semiconductor component manufacturers are constantly striving to increase the performance of their products, while decreasing their cost of manufacture. Because semiconductor components such as microprocessors and memory elements can contain up to a billion transistors, the focus for increasing performance and lowering manufacturing cost has been to shrink the sizes of the transistors making up the semiconductor components. This has introduced surface topographies that have decreased the planarity of the surfaces. In addition, shrinking the transistors increases their surface roughness. Non-planar surfaces that arise during intermediate manufacturing steps can create imperfections such as voids in layers subsequently formed over the non-planar surface. These imperfections degrade device performance. FIG. 1 illustrates a portion of a prior art Electrically Erasable and Programmable Read Only Memory Device ("EEPROM") 10 during an intermediate stage of manufacture. EEPROM 10 comprises a semiconductor substrate 12 having a major surface 14 and Shallow Trench Isolation ("STI") structures 16. A layer of dielectric material 18 is formed on major surface 14. Floating gates 20 and 22 are disposed on portions of dielectric layer 18 and are spaced apart from each other by a gap. The initial width of the gap is indicated by arrows 24. An Oxide-Nitride-Oxide ("ONO") dielectric structure 19 is formed on floating gates 20 and 22. A layer of polysilicon 28 having a surface 30 is disposed on dielectric structure 19. Because floating gates 20 and 22 create a surface topography over surface 14, a void 32 forms in the portion of polysilicon layer 28 between floating gates 20 and 22, i.e., in the region of the gap. Void 32 degrades the performance of the devices comprising EEPROM 10 and, therefore, it degrades the performance of EEPROM 10.

In addition, when layers such as polysilicon layer 28 are formed, their surfaces are not smooth but have a surface roughness associated with them. Typically, this surface roughness has a Root Mean Square (RMS) surface roughness of greater than 75 Angstroms (Å). As the transistors are made smaller, this surface roughness adversely affects subsequent photolithographic steps. For example, a photoresist layer 34 deposited on polysilicon layer 28 having a rough surface 30, will have a "wavy," i.e., non-planar, surface. When photoresist layer 34 is exposed to light, the waviness increases the reflection of light within photoresist layer 34, which degrades the quality of the pattern formed in the photoresist layer. For small geometry devices, this degradation may lower the performance of the transistors or decrease their yield.

Accordingly, what is needed is a semiconductor component and method for its manufacture, wherein the semiconductor component has void-free layers with smooth surfaces.

SUMMARY OF THE INVENTION

The present invention satisfies the foregoing need by providing a semiconductor component having void-free conductive layers with smooth surfaces and a method for manufacturing the semiconductor component. In accordance with one aspect, the present invention comprises manufacturing a semiconductor device by providing a semiconductor substrate having a major surface and forming first and second surface features over the major surface. A first polysilicon layer is formed over the first and second surface features. The first polysilicon layer is redistributed in at least the region between the first and second surface features.

In accordance with another aspect, the present invention comprises a method for manufacturing a semiconductor component that includes providing a semiconductor substrate having a major surface and forming a first dielectric material on the major surface. First and second conductors are formed over first and second portions of the first dielectric material, wherein the first and second conductors have a gap between them. A second dielectric material is formed over the first and second conductors and a first layer of polysilicon is formed over the second dielectric material. Atoms from the first layer of polysilicon are then repositioned to fill any voids within the first layer of polysilicon and smooth its surface.

In accordance with yet another aspect, the present invention comprises a semiconductor component that includes a semiconductor substrate having a major surface. A dielectric material is disposed on the major surface. First and second conductors are disposed on first and second portions of the dielectric material, respectively. A second dielectric material is disposed on the first and second conductors. A void-free layer of polysilicon having a polysilicon surface is disposed on the second layer of dielectric material, wherein the polysilicon surface has a surface roughness of less than about 50 Angstroms.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a semiconductor component having void-free electrically conductive layers and a method for forming the void-free electrically conductive layers. In addition to being void-free, the electrically conductive layers have smooth surfaces, i.e., an RMS surface roughness of less than about 50 Angstroms (Å). When an electrically conductive material, such as doped polysilicon, is deposited on a surface, voids form therein if the surface on which it is being deposited is too rough. In accordance with an embodiment of the present invention, the voids are eliminated by annealing the doped polysilicon material in a hydrogen ambient. The hydrogen anneal redistributes the silicon atoms such that they fill the voids. In addition, the hydrogen anneal smoothes the surface of the doped polysilicon material. After deposition the surfaces of the polysilicon layers typically have an RMS surface roughness of greater than 75 Angstroms (Å). After performing the hydrogen anneal in accordance with the present invention, the RMS surface roughness is less than about 50 Å. The smoother surfaces allow forming smaller geometry semiconductor devices using photolithographic techniques.

Figure 1:
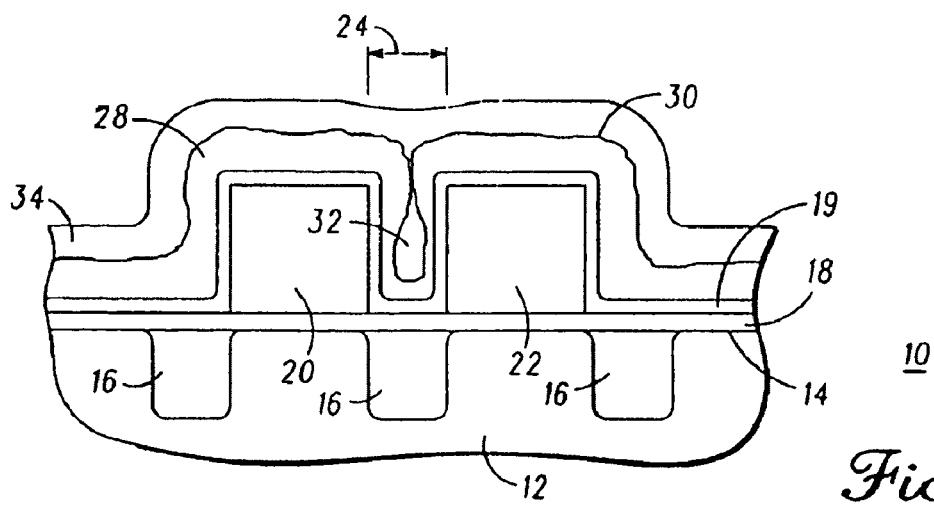
FIG. 1 is a cross-sectional side view of a portion of a prior art semiconductor component at an intermediate stage of manufacture.
Figure 2:
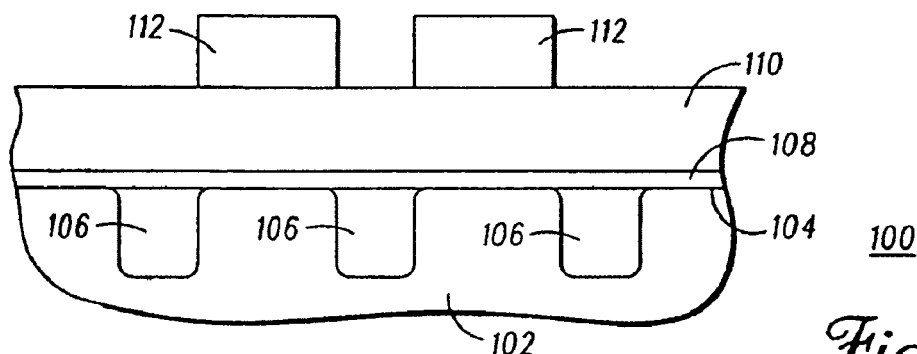
FIG. 2 is a cross-sectional side view of the a semiconductor component at an early stage of manufacture in accordance with an embodiment of the present invention.

FIG. 2 is a cross-sectional side view of a portion of a semiconductor component 100 during manufacture in accordance with an embodiment of the present invention. What is shown in FIG. 1 is a substrate 102 having a major surface 104 and a plurality of Shallow Trench Isolation ("STI") structures 106 formed therein. Techniques for forming STI structures 106 are known to those skilled in the art. Suitable materials for substrate 102 include silicon, silicon germanium, germanium, Silicon-On-Insulator (SOI), and the like. The semiconductor material may also be a semiconductor substrate having an epitaxial layer formed thereon. The conductivity type of substrate 102 is not a limitation of the present invention. In accordance with the present embodiment, the conductivity type is chosen to form an N-channel insulated gate semiconductor device. However, the conductivity type can be selected to form a P-channel insulated gate semiconductor device or a complementary insulated gate semiconductor device, e.g., a Complementary Metal Oxide Semiconductor (CMOS) device. A layer of dielectric material 108 is formed on major surface 104. Dielectric layer 108 serves as a gate dielectric material. By way of example, dielectric layer 108 is formed using thermal oxidation and has a thickness ranging from approximately 15 Å to approximately 500 Å.

A layer of polysilicon 110 is conformally formed on dielectric layer 108 using, for example, a chemical vapor deposition technique. A suitable range of thicknesses for polysilicon layer 110 is between approximately 300 Å and approximately 2,000 Å. A layer of photoresist is deposited on polysilicon layer 110 and patterned to form an etch mask layer 112.

Figure 3:
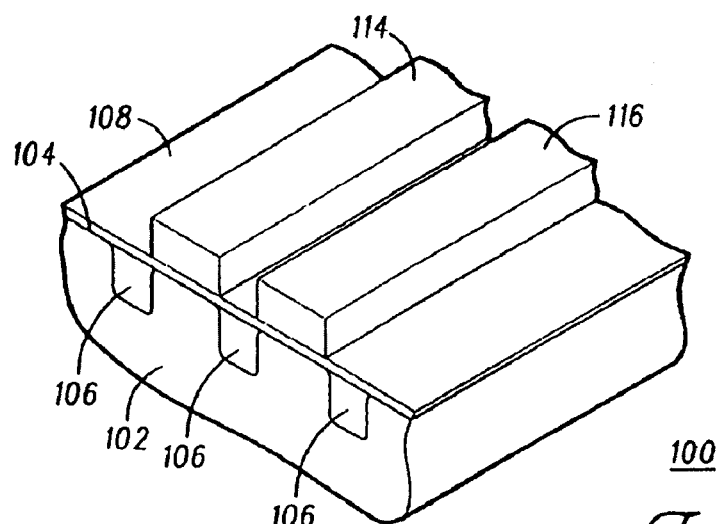
FIG. 3 is an isometric view of the semiconductor component of FIG. 2 at a later stage of manufacture.

Referring now to FIG. 3, an isometric view of semiconductor component 100 is shown further along in processing. It should be noted that FIG. 3 is shown as an isometric view to provide a frame of reference for the locations at which the cross-sectional side views of FIGS. 2 and 4–6 are taken. Polysilicon layer 110 is etched using an etch chemistry that preferentially etches polysilicon to form surface features on substrate 102. By way of example, polysilicon layer 110 is etched using anisotropic Reactive Ion Etching (RIE). Methods for etching polysilicon are well known to those skilled in the art. Then etch mask layer 112 is removed. The surface features or remaining portions of polysilicon layer 110 cooperate with the portions of dielectric layer 108 between surface 104 and the remaining portions of polysilicon layer 110 to form gate structures 114 and 116.

Figure 4:
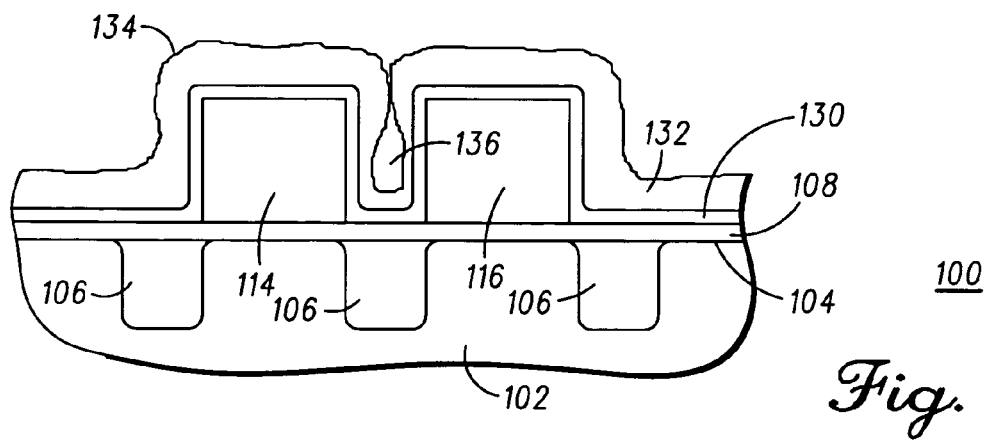
FIG. 4 is a cross-sectional side view of the semiconductor component of FIG. 3 at a later stage of manufacture.

Referring now to FIG. 4, a cross-sectional side view of semiconductor component 100 is shown further along in manufacture. A dielectric material 130 is deposited on gate structures 114 and 116. By way of example, dielectric material 130 is an Oxide-Nitride-Oxide (ONO) structure having a thickness ranging between approximately 100 Å and approximately 200 Å. A layer of polysilicon material 132 having a major surface 134 and a thickness ranging from a monolayer of polysilicon to approximately 300 Å is formed on ONO structure 130. By way of example, polysilicon layer 132 is formed using chemical vapor deposition. After deposition, surface 134 has a Root Mean Square (RMS) surface roughness of greater than 75 Å. A void 136 may form during deposition of polysilicon layer 132.

Figure 5:
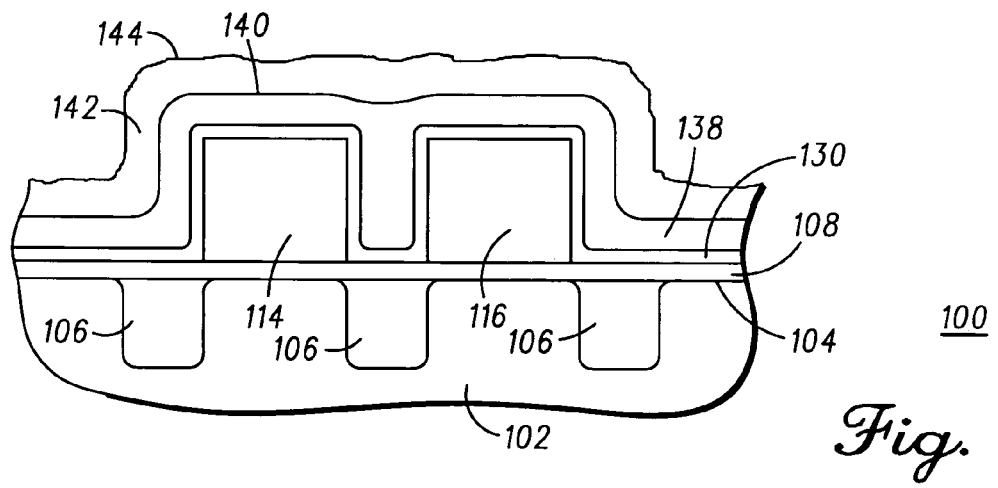
FIG. 5 is a cross-sectional side view of the semiconductor component of FIG. 4 at a later stage of manufacture.

Referring now to FIG. 5, semiconductor component 100 is annealed in a hydrogen ($H_2$) ambient to redistribute or reposition the silicon atoms of polysilicon layer 132 and form a void-free polysilicon layer 138 having a smoothed surface 140 and a thickness of less than about 300 Å. Redistribution of the silicon atoms fills void 136 and any other void that may have formed in polysilicon layer 132 and smoothes surface 134 such that it has an RMS surface roughness that is preferably less than about 50 Å and even more preferably less than about 20 Å. To distinguish the smooth-surfaced, void-free electrically conductive layer from electrically conductive layer 132 that contains voids and has a rough surface, reference numbers different from 132 and 134 have been used to identify the electrically conductive layer and its surface, respectively. In particular, reference 138 has been used to identify the annealed polysilicon layer and reference number 140 has been used to identify its surface which is smooth. By way of example, polysilicon layer 132 is annealed at a temperature ranging from about 750 degrees Celsius (° C.) to about 1,100° C., a pressure ranging from about 10 Pascals (Pa) to about 40 kiloPa, and a time ranging from about 5 seconds to about 60 minutes. The parameters for annealing polysilicon layer 132 (e.g., temperature, pressure, and time) are not a limitation of the present invention.

Still referring to FIG. 5, a layer of polysilicon 142 having a major surface 144 and a thickness ranging from about 1,000 Å to about 1,500 Å is formed on annealed polysilicon layer 138. Although polysilicon layer 142 is formed on a smooth surface, it may still contain voids and have surface imperfections such as roughness that are undesirable.

Figure 6:
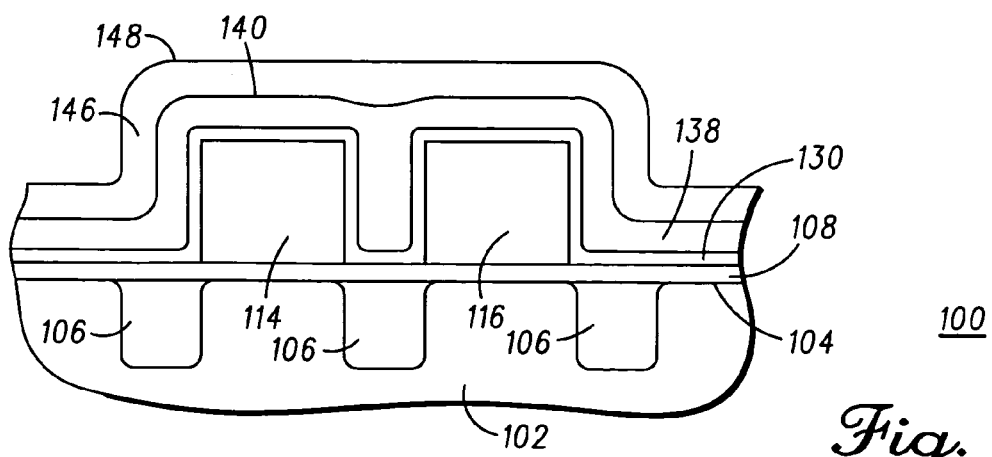
FIG. 6 is a cross-sectional side view of the semiconductor component of FIG. 5 at a later stage of manufacture.

Referring now to FIG. 6, layer of polysilicon 142 is annealed in a hydrogen ambient to redistribute or reposition the silicon atoms of polysilicon layer 142, thereby forming an annealed polysilicon layer 146 having a smoothed surface 148 and a thickness ranging from about 1,000 Å to about 1,500 Å. The annealing conditions are similar to those described with reference to annealing polysilicon layer 132. Like polysilicon layer 132/138, to distinguish the smooth-surfaced, void-free electrically conductive layer from electrically conductive layer 142 that contains voids and has a rough surface, different reference numbers have been used to identify the polysilicon layer and its surface, respectively. In particular, reference number 146 has been used to identify the annealed polysilicon layer and reference number 148 has been used to identify its smooth surface. After annealing, smoothed surface 148 preferably has an RMS surface roughness of less than about 50 Å and even more preferably an RMS surface roughness of less than about 20 Å.

Figure 7:
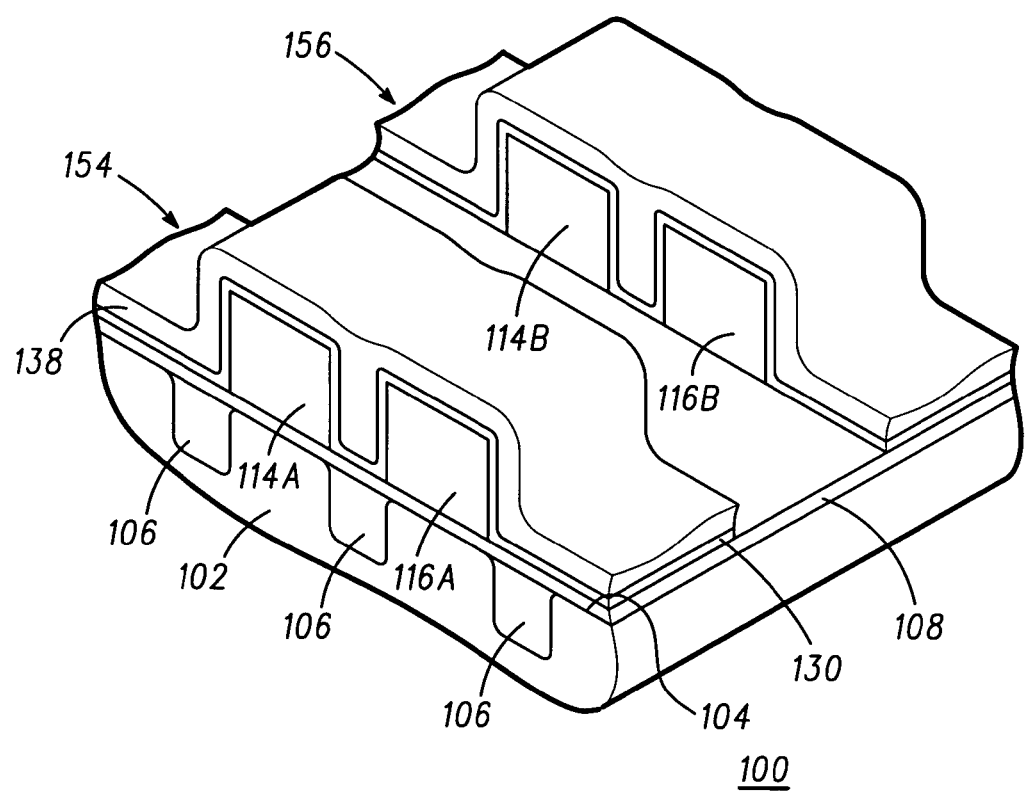
FIG. 7 is an isometric view of the semiconductor component of FIG. 6 at a later stage of manufacture.

Referring now to FIG. 7, an isometric view of semiconductor component 100 is shown further along in processing. It should be noted that FIG. 7 is shown as an isometric view to facilitate the description of the manufacture of semiconductor component 100. A layer of photoresist (not shown) is patterned on annealed polysilicon layer 146 to form an etch mask layer. Annealed polysilicon layer 146, ONO dielectric structure 130, and gate structures 114 and 116 are etched, respectively, to form floating gates 114A, 114B, 116A, and 1116B. By way of example, annealed polysilicon layer 146 is etched using anisotropic Reactive Ion Etching (RIE). Then the etch mask layer is removed. The remaining portions 154 and 156 of annealed polysilicon layer 146 serve as control gate structures.

After formation of control gate structures such as control gate structures 154 and 156, a layer of dielectric material (not shown) is patterned over substrate 102 and control gate structures 154 and 156 to expose portions of gate structures 154 and 156 in which silicide is to be formed. Silicide (not shown) is formed in the exposed portions of control gate structures 154 and 156 in preparation for forming contacts to the control gate structures. A layer of dielectric material is patterned over the exposed portions of the silicided regions. Contact structures are formed to the exposed silicided regions.

By now it should be appreciated that a semiconductor component having void-free electrically conductive layers with smoothed surfaces and a method for manufacturing the semiconductor component have been provided. An advantage of forming void-free electrically conductive layers in accordance with the present invention is that the resistance of the void-free conductor layers is reduced, thereby improving the performance of the semiconductor component. Another advantage of smoothing the surfaces of the electrically conductive layers is that photoresist layers formed on the electrically conductive layers are not "wavy," which results in a reduction in the reflection of light during the photolithographic steps. Reducing light reflection allows the formation of smaller geometry devices using photolithographic techniques.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
    providing a semiconductor substrate having a major surface;
    forming first and second surface features over the major surface;
    forming a first polysilicon layer over the first and second surface features; and
    redistributing the first polysilicon layer in at least the region between the first and second surface features.

2. The method of claim 1, wherein redistributing the first polysilicon layer comprises annealing the first polysilicon layer.

3. The method of claim 2, wherein annealing the first polysilicon layer comprises annealing the first polysilicon layer in an ambient comprising hydrogen.

4. The method of claim 3, wherein annealing the first polysilicon layer includes heating the first polysilicon layer to a temperature ranging between approximately 750 degrees Celsius and approximately 1,100 degrees Celsius.

5. The method of claim 2, further including forming a second polysilicon layer over the first polysilicon layer.

6. The method of claim 5, further including redistributing the second polysilicon layer.

7. The method of claim 6, wherein redistributing the second polysilicon layer includes annealing the second polysilicon layer in a hydrogen ambient.

8. The method of claim 7, wherein annealing the second polysilicon layer includes heating the second polysilicon layer to a temperature of at least 750 degrees Celsius.

9. A method for manufacturing a semiconductor component, comprising:
    providing a semiconductor substrate having a major surface;
    forming a first dielectric material on the major surface;
    forming first and second conductors over first and second portions of the first dielectric material, the first and second conductors having a gap therebetween;
    forming a second dielectric material over the first and second conductors;
    forming a first layer of polysilicon over the first and second conductors; and
    repositioning atoms of the first layer of polysilicon.

10. The method of claim 9, wherein forming the first and second conductors comprises:
    forming a second layer of polysilicon over the first dielectric material; and
    patterning the second layer of polysilicon over the first dielectric material to form the first and second conductors.

11. The method of claim 9, wherein forming the first layer of polysilicon over the first and second conductors comprises forming a third dielectric material on the first and second conductors and forming the first layer of polysilicon on the third dielectric material.

12. The method of claim 11, wherein repositioning atoms of the first layer of polysilicon comprises annealing the first layer of polysilicon.

13. The method of claim 11, wherein repositioning atoms of the first layer of polysilicon comprises heating the first layer of polysilicon to a temperature of at least 750 degrees Celsius.

14. The method of claim 11, further including forming a second layer of polysilicon over the first layer of polysilicon.

15. The method of claim 14, further including annealing the second layer of polysilicon.

16. The method of claim 11, wherein forming the first layer of polysilicon includes forming the first layer of polysilicon to have a thickness ranging between a monolayer of polysilicon and about 300 Angstroms.

17. The method of claim 9, wherein repositioning atoms of the first layer of polysilicon includes repositioning the atoms in an ambient comprising hydrogen.

* * * * *